US012568599B2

(12) United States Patent
Yang et al.

(10) Patent No.: US 12,568,599 B2
(45) Date of Patent: Mar. 3, 2026

(54) DATA PROCESSING DEVICE, CHASSIS AND TRAY

(71) Applicant: Wiwynn Corporation, New Taipei City (TW)

(72) Inventors: Feng-Yuan Yang, New Taipei City (TW); Yan-Yu Chen, New Taipei City (TW)

(73) Assignee: Wiwynn Corporation, New Taipei City (TW)

( * ) Notice: Subject to any disclaimer, the term of this patent is extended or adjusted under 35 U.S.C. 154(b) by 168 days.

(21) Appl. No.: 18/536,269

(22) Filed: Dec. 12, 2023

(65) Prior Publication Data

US 2025/0081382 A1      Mar. 6, 2025

(30) Foreign Application Priority Data

Sep. 4, 2023    (TW) .................................. 112133475

(51) Int. Cl.
*H05K 7/14* (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS 7,301,778 B1 * 11/2007 Fang .................... H05K 7/1409
                                                          361/801
7,420,812 B2 * 9/2008 Chen .................... E05B 65/006
                                                          361/679.55

8,616,662 B2 * 12/2013 Yin ...................... H05K 7/1489
                                                          361/679.33
8,869,994 B2 * 10/2014 He ........................ H05K 7/1489
                                                          211/26
9,420,716 B2 * 8/2016 Ivey ..................... H05K 7/1415
11,330,728 B2 * 5/2022 Ye .......................... H05K 5/023
2006/0134953 A1 * 6/2006 Williams ............. H05K 7/1411
                                                          439/157
2011/0110032 A1 * 5/2011 Kuo ........................ G06F 1/185
                                                          248/291.1
2013/0241377 A1 * 9/2013 Zhang ..................... G06F 1/181
                                                          403/188
2015/0327389 A1 * 11/2015 Westphall ........ H01R 13/62988
                                                          361/748
2022/0349225 A1 * 11/2022 Yeh ........................ E05B 1/0046

FOREIGN PATENT DOCUMENTS

TW              M600519 U      8/2020

* cited by examiner

*Primary Examiner* — Xanthia C Relford
(74) *Attorney, Agent, or Firm* — Winston Hsu

(57) ABSTRACT

A data processing device includes a chassis and at least one electronic component. The chassis includes a casing and a tray disposed in the casing. The tray includes a tray body and an operating member pivotally connected to the tray body. The tray body has an accommodating space. When the operating member is located at a closed position, the operating member and the casing are locked, and the at least one electronic component is able to be accommodated in the accommodating space. When the at least one electronic component is removed from the accommodating space, the operating member is able to rotate from the closed position to an opened position located in the accommodating space to be unlocked from the casing, so as to allow the tray to be removed from the casing.

26 Claims, 16 Drawing Sheets

FIG. 5

DATA PROCESSING DEVICE, CHASSIS AND TRAY

BACKGROUND OF THE INVENTION

1. Field of the Invention

The invention relates to a data processing device, a chassis and a tray and, more particularly, to a tray with an operating member hidden inside, and a data processing device and a chassis equipped with the tray.

2. Description of the Prior Art

With the rise of big data, machine learning, the Internet of Things, and various network platforms, the demand for servers in life is getting higher and higher, wherein blade servers adopt a modular design, such that more servers can be accommodated in a specific space and management and wiring can be simplified. In general, a tray may be disposed in a chassis to carry the blade server. A front bezel of the tray is equipped with a handle and the handle is pulled outward to extract the tray. However, the handle will occupy the setting space of the front bezel of the tray, such that it is hard to install more components (e.g. E1.S solid state drives, network cards, etc.), and it is also hard to add heat dissipation holes. Furthermore, in some devices, the blade server should be removed before the tray can be removed. Since the handle can be directly pulled outward to (e.g., concurrently) extract the tray and the blade server thereon, the blade server may be damaged.

SUMMARY OF THE INVENTION

According to an embodiment of the invention, a data processing device comprises a chassis and at least one electronic component. The chassis comprises a casing and a tray disposed in the casing. The tray comprises a tray body and an operating member pivotally connected to the tray body. The tray body has an accommodating space. When the operating member is located at a closed position, the operating member and the casing are locked, and the at least one electronic component is able to be accommodated in the accommodating space. When the at least one electronic component is removed from the accommodating space, the operating member is able to rotate from the closed position to an opened position located in the accommodating space to be unlocked from the casing, so as to allow the tray to be removed from the casing.

According to an embodiment of the invention, a chassis comprises a casing and a tray. The tray is disposed in the casing. The tray comprises a tray body and an operating member pivotally connected to the tray body. The tray body has an accommodating space. When the operating member is located at a closed position, the operating member and the casing are locked. When the operating member rotates from the closed position to an opened position located in the accommodating space, the operating member is unlocked from the casing, so as to allow the tray to be removed from the casing.

According to an embodiment of the invention, a tray is adapted to be disposed in a casing. The tray comprises a tray body and an operating member. The tray body has an accommodating space. The operating member is pivotally connected to the tray body. When the operating member is located at a closed position, the operating member and the casing are locked. When the operating member rotates from the closed position to an opened position located in the accommodating space, the operating member is unlocked from the casing, so as to allow the tray to be removed from the casing.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Figure 5:
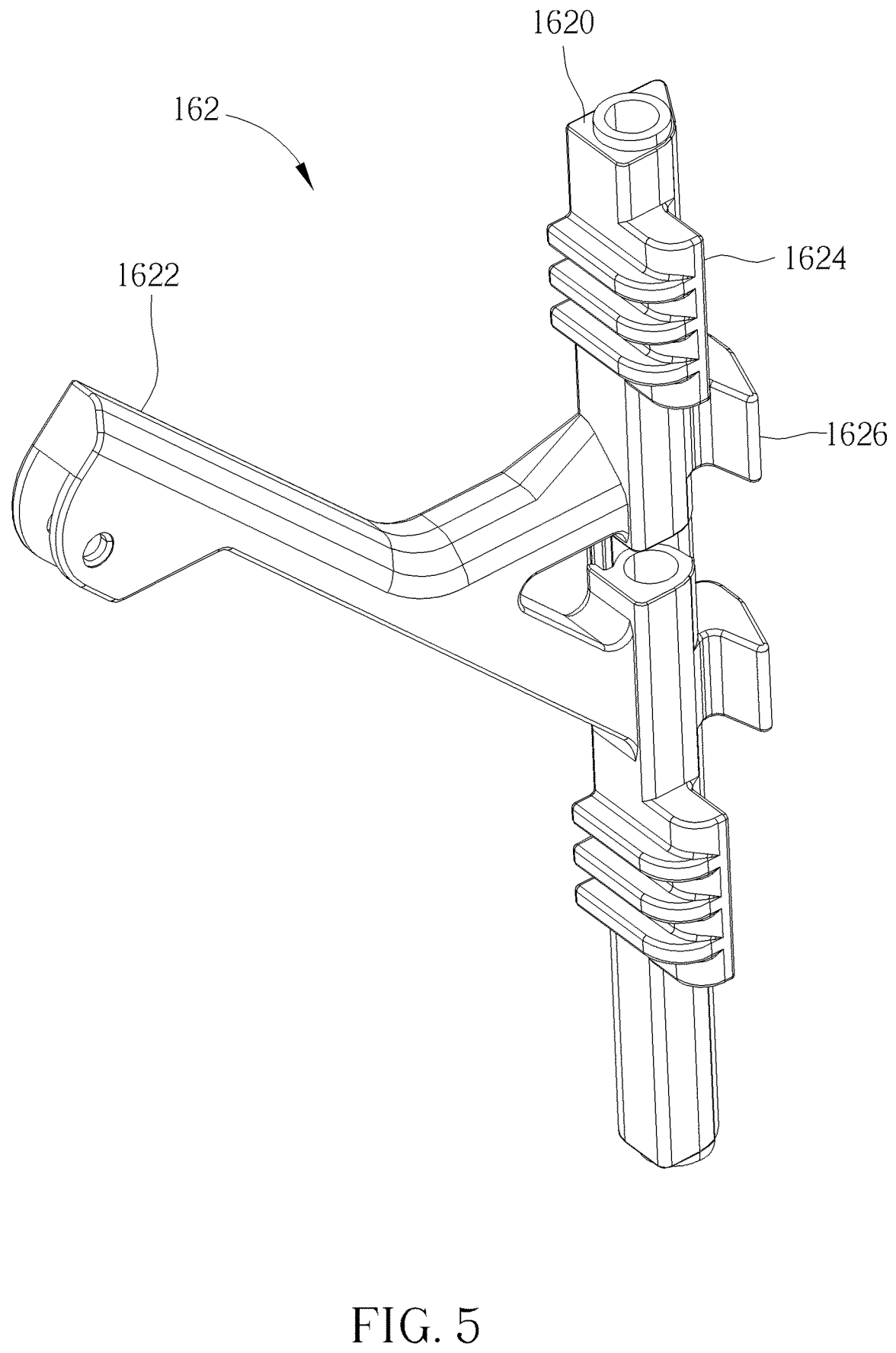

FIG. 5 is a perspective view illustrating an operating member according to an embodiment.

DETAILED DESCRIPTION

Figure 1:
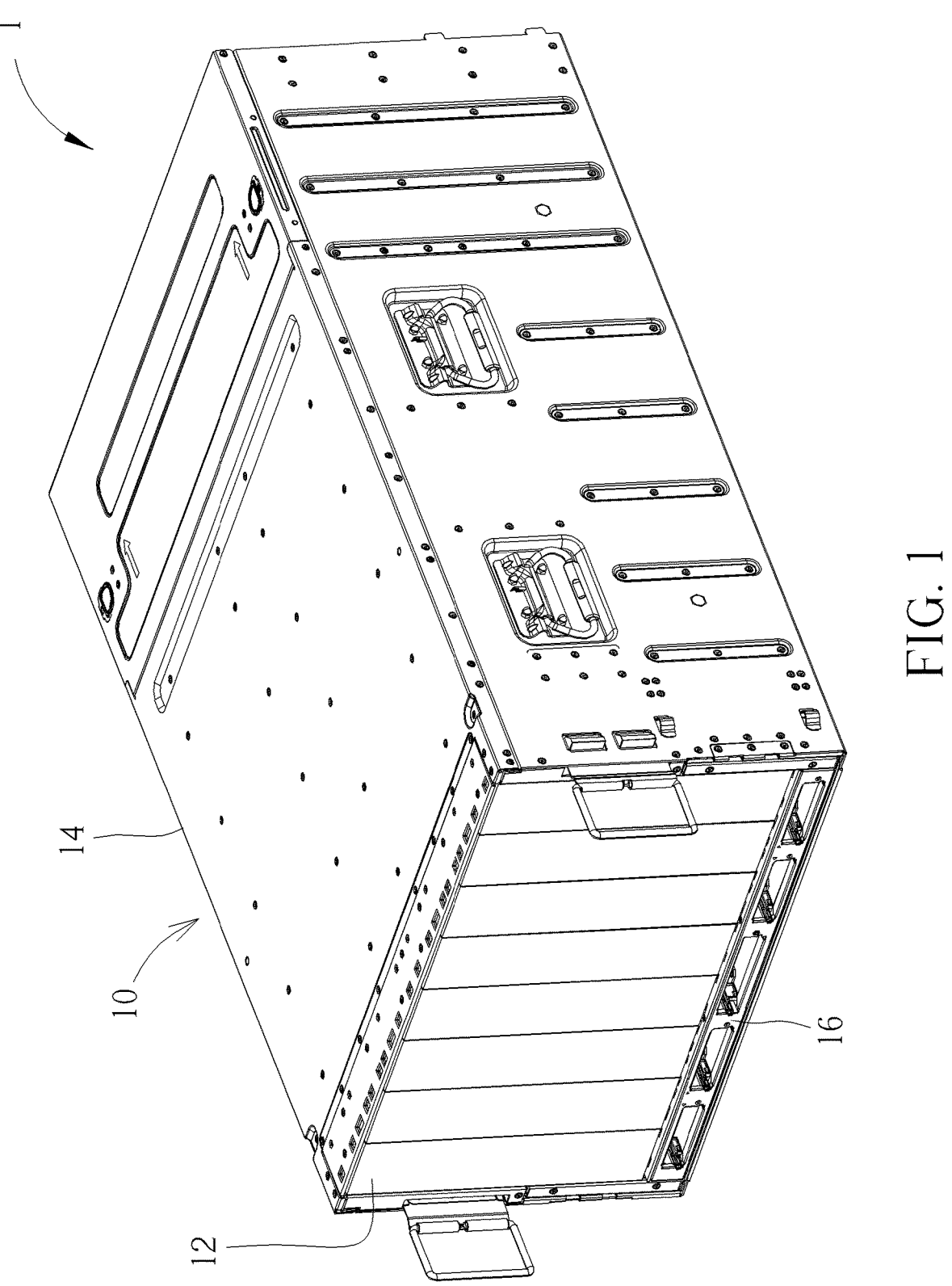
FIG. 1 is a perspective view illustrating a data processing device according to an embodiment of the invention.
Figure 2:
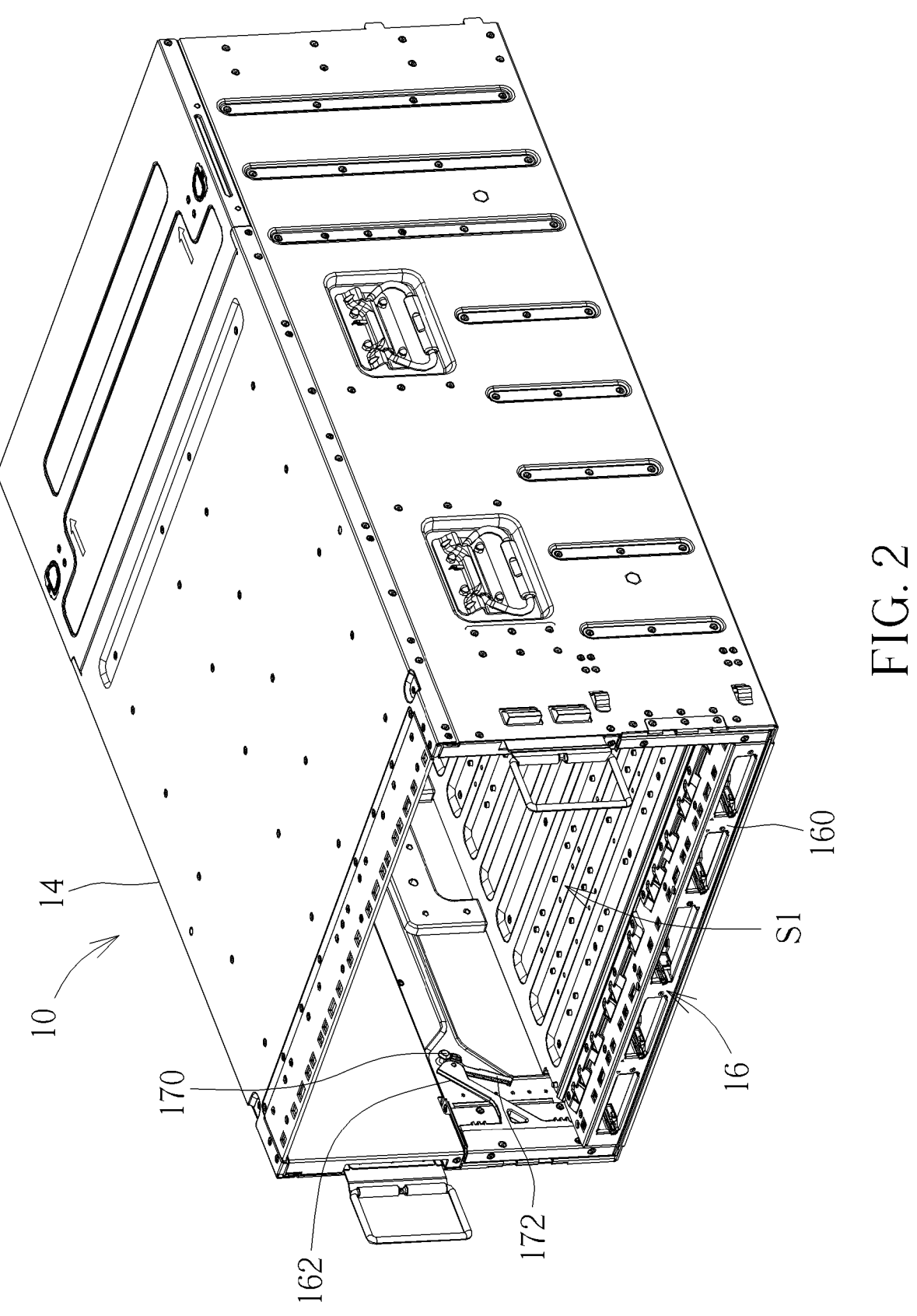
FIG. 2 is a perspective view illustrating a chassis according to an embodiment.
Figure 3:
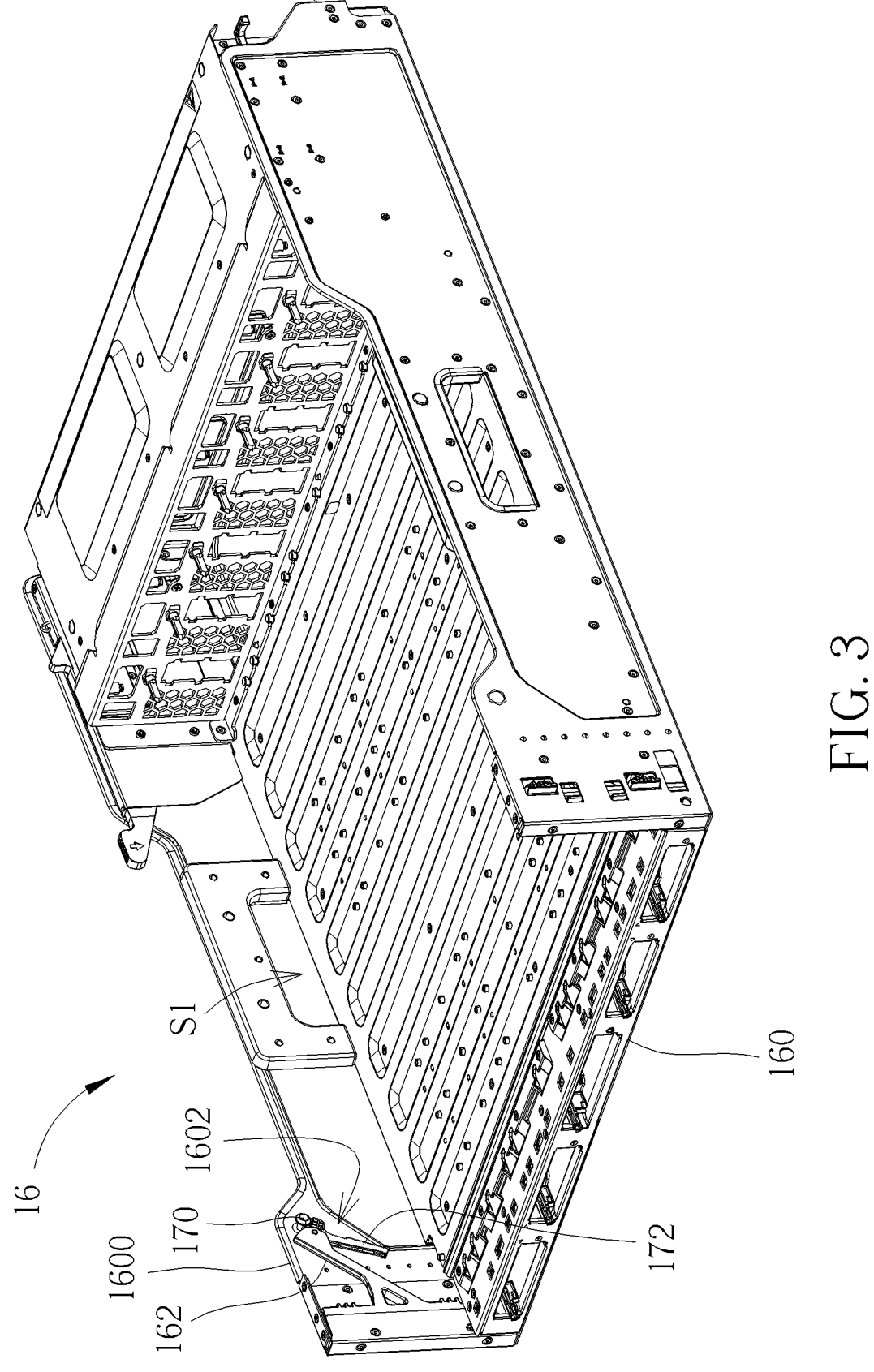
FIG. 3 is a perspective view illustrating a tray according to an embodiment.
Figure 4:
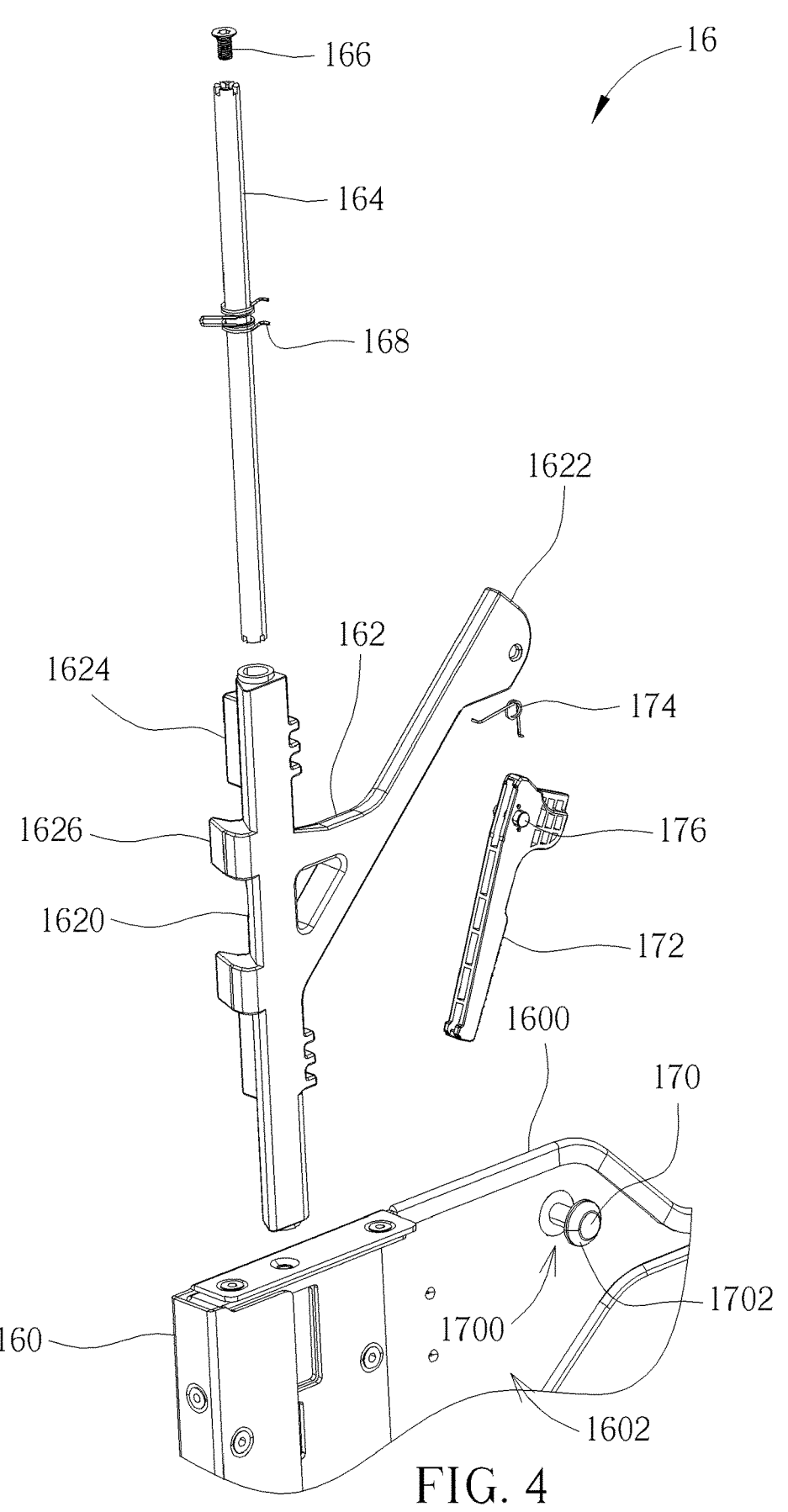
FIG. 4 is a partial exploded view illustrating the tray according to an embodiment.
Figure 6:
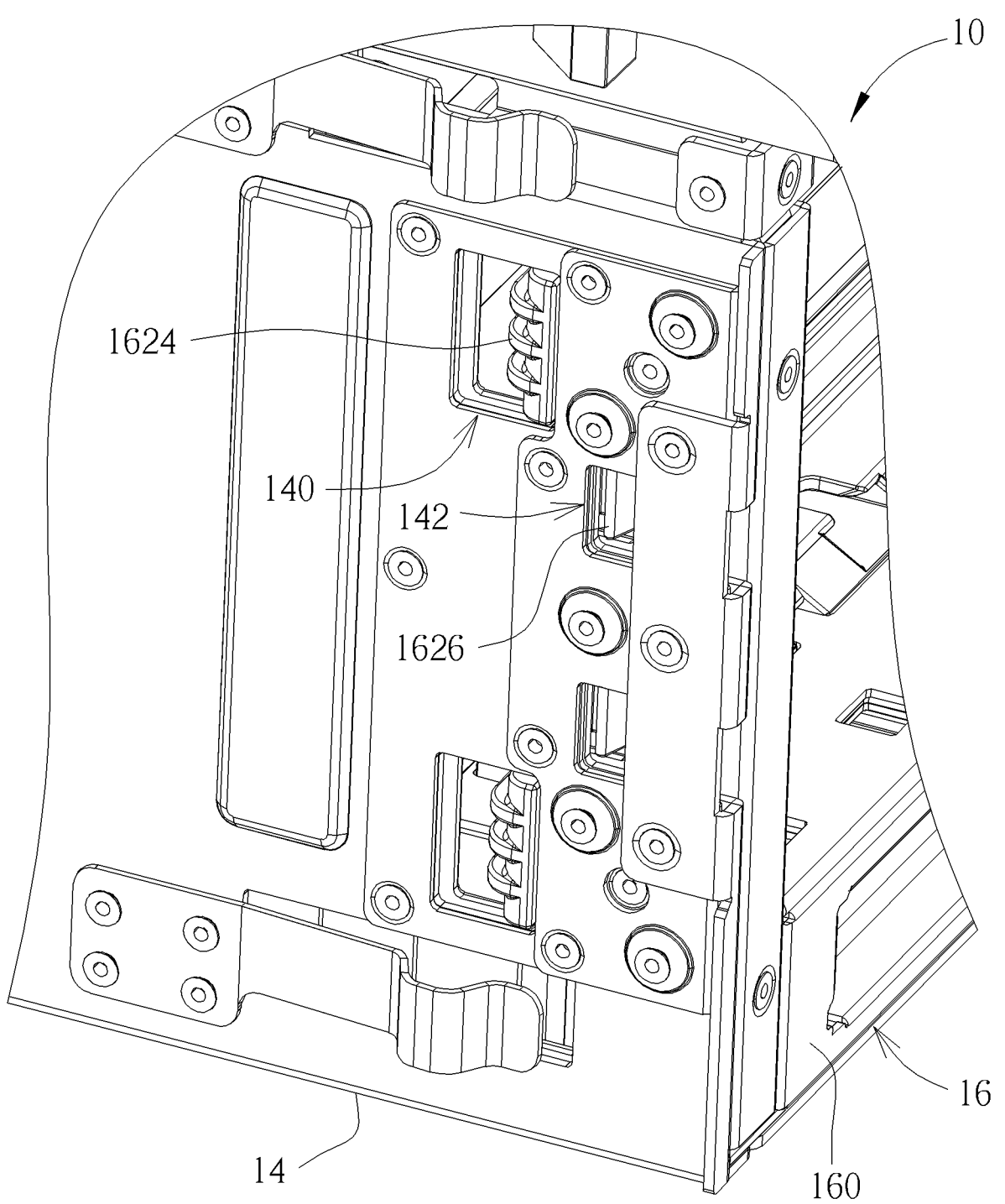
FIG. 6 is a partial perspective view illustrating the chassis according to an embodiment.
Figure 7:
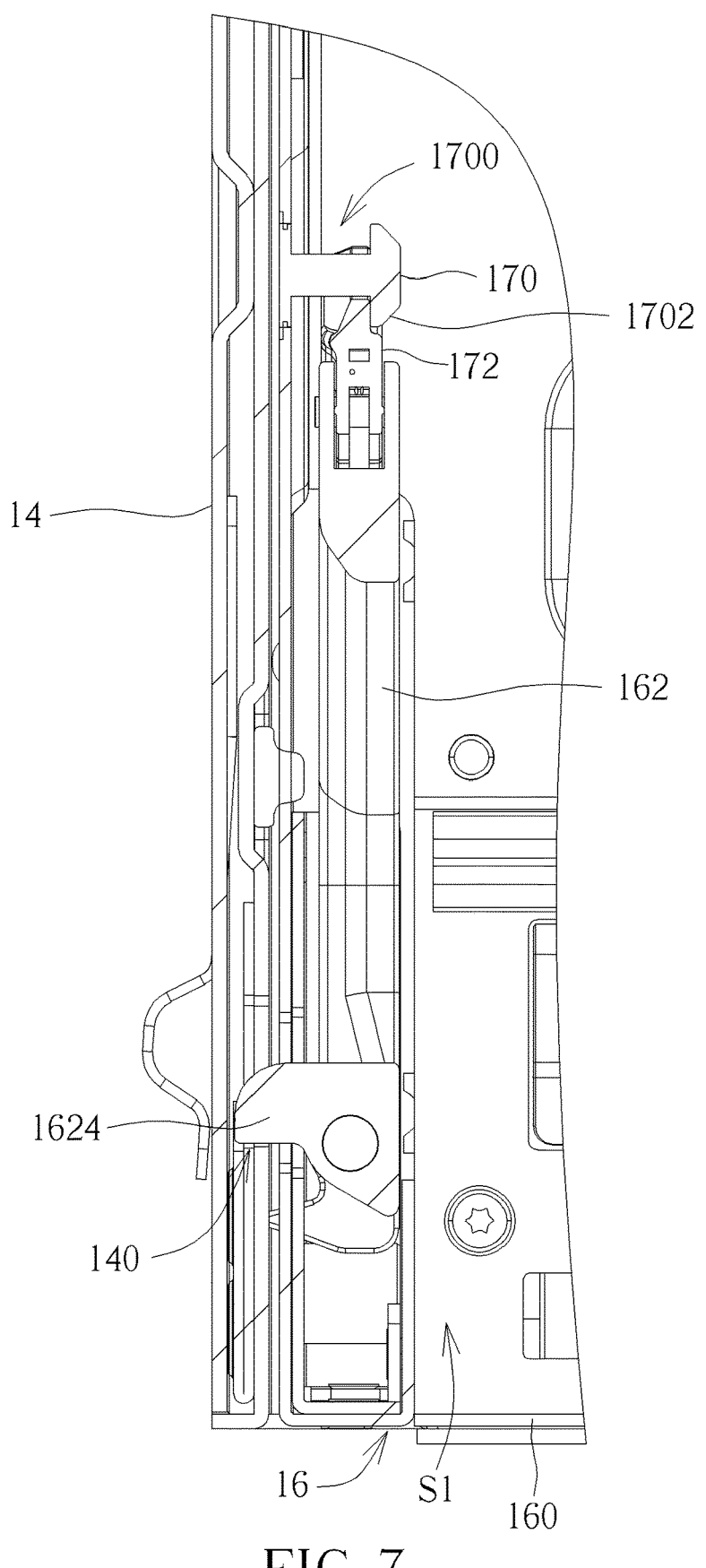
FIG. 7 is a partial sectional view illustrating the operating member located at a closed position according to an embodiment.
Figure 8:
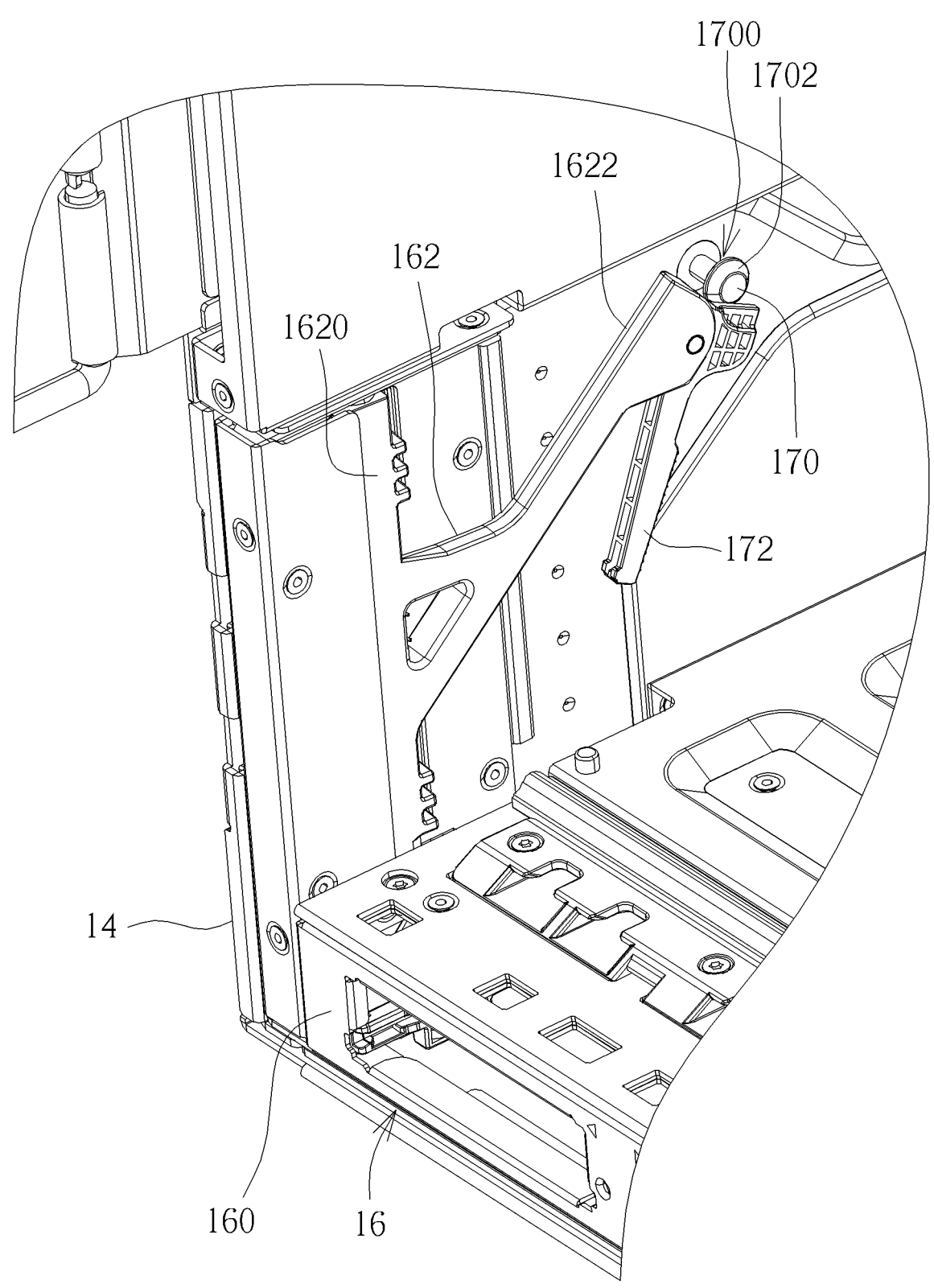
FIG. 8 is a partial perspective view illustrating a second restraining member unlocked from a first restraining member according to an embodiment.
Figure 9:
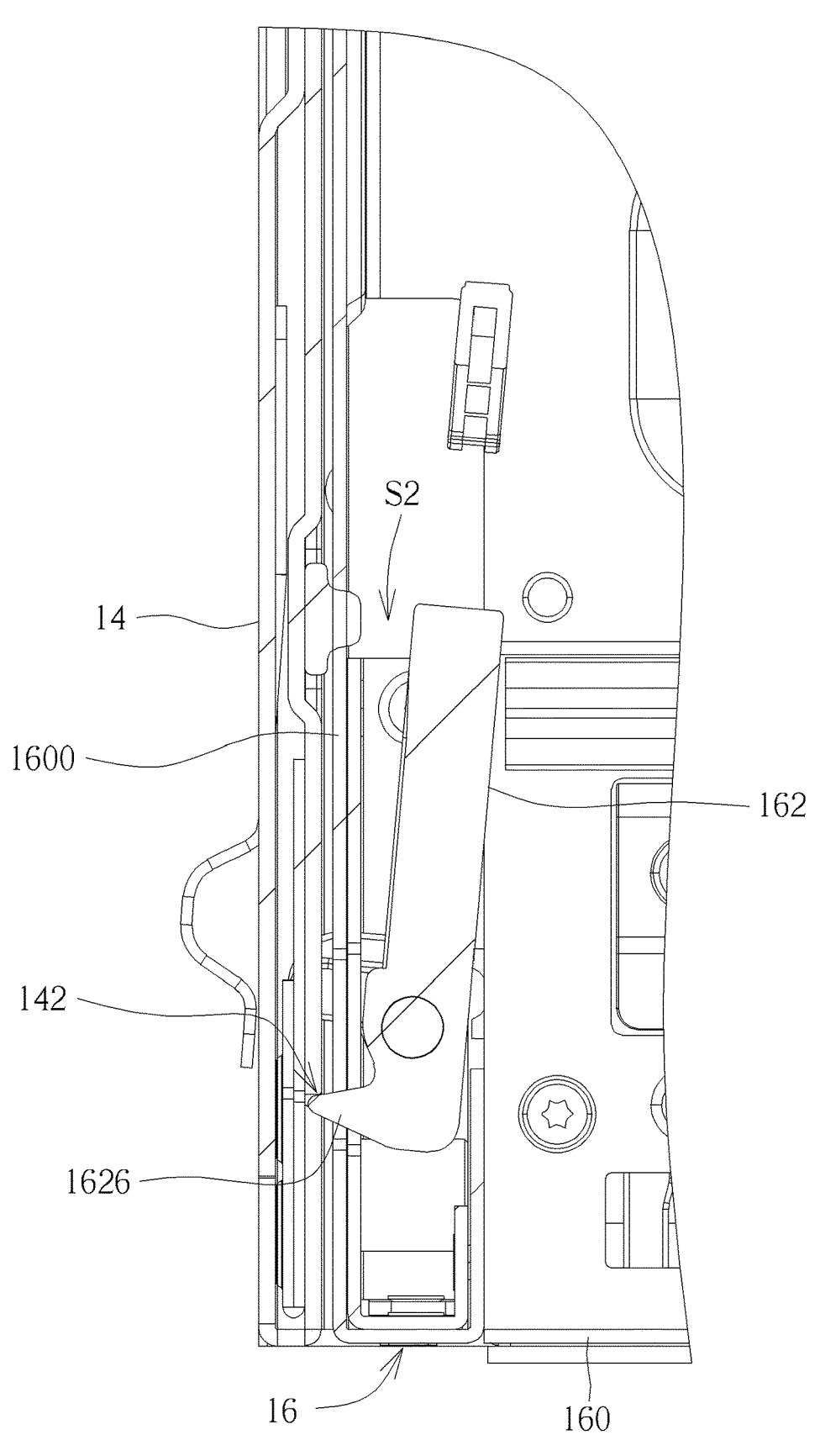
FIG. 9 is a partial sectional view illustrating an operating space formed between the operating member and a side wall according to an embodiment.
Figure 10:
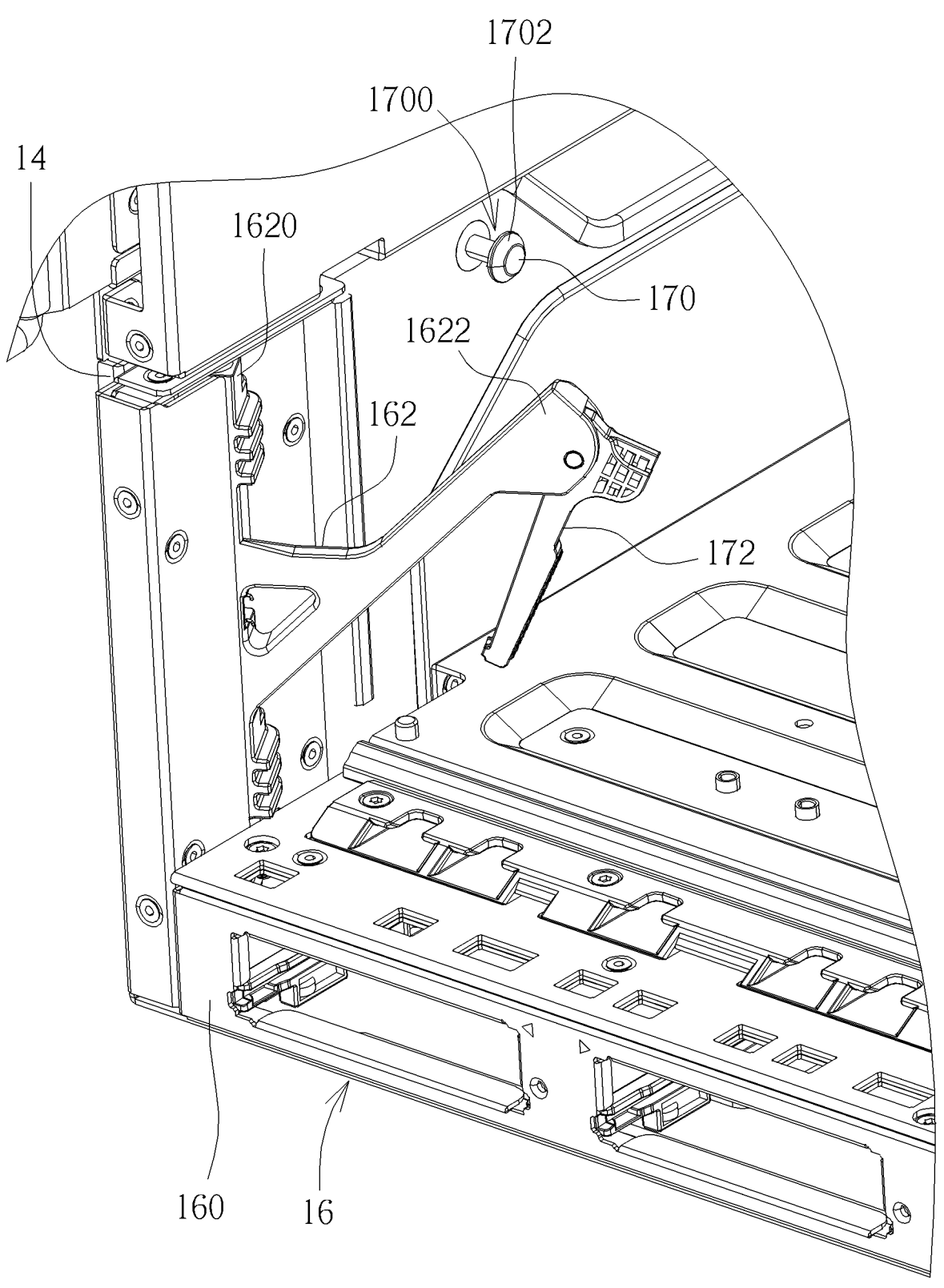
FIG. 10 is a partial perspective view illustrating the operating member located at an opened position according to an embodiment.
Figure 11:
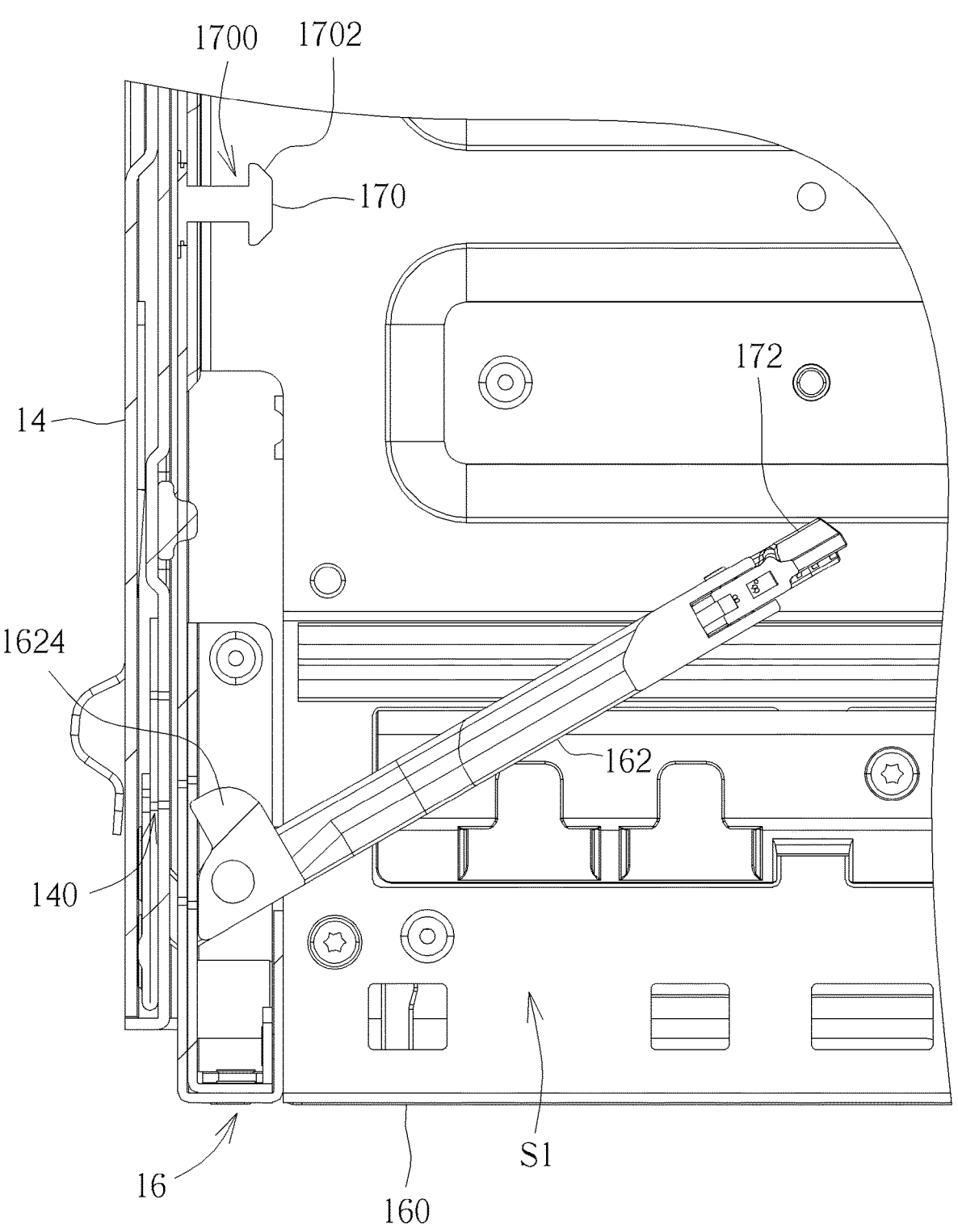
FIG. 11 is a partial sectional view illustrating the operating member located at the opened position according to an embodiment.
Figure 12:
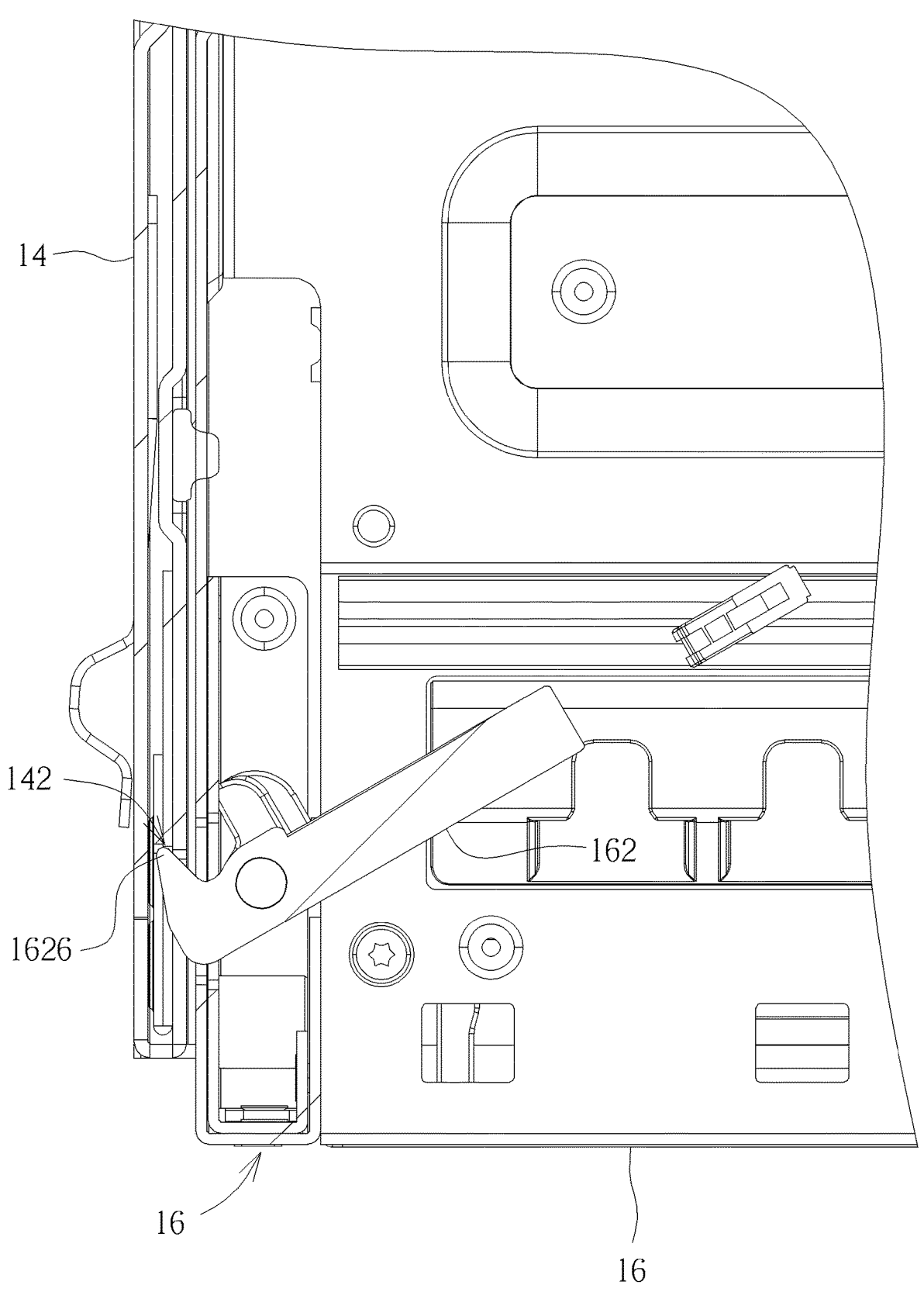
FIG. 12 is another partial sectional view illustrating the operating member located at the opened position according to an embodiment.

Referring to FIGS. 1 to 12, FIG. 1 is a perspective view illustrating a data processing device 1 according to an embodiment of the invention, FIG. 2 is a perspective view illustrating a chassis 10 according to an embodiment, FIG. 3 is a perspective view illustrating a tray 16 according to an embodiment, FIG. 4 is a partial exploded view illustrating the tray 16 according to an embodiment, FIG. 5 is a perspective view illustrating an operating member 162 according to an embodiment, FIG. 6 is a partial perspective view illustrating the chassis 10 according to an embodiment, FIG. 7 is a partial sectional view illustrating the operating member 162 located at a closed position according to an embodiment, FIG. 8 is a partial perspective view illustrating a second restraining member 172 unlocked from a first restraining member 170 according to an embodiment, FIG. 9 is a partial sectional view illustrating an operating space S2 formed between the operating member 162 and a side wall 1600 according to an embodiment, FIG. 10 is a partial perspective view illustrating the operating member 162 located at an opened position according to an embodiment, FIG. 11 is a partial sectional view illustrating the operating member 162 located at the opened position according to an embodiment, and FIG. 12 is another partial sectional view illustrating the operating member 162 located at the opened position according to an embodiment.

As shown in FIGS. 1 to 3, the data processing device 1 comprises a chassis 10 and at least one electronic component 12. The electronic component 12 may be a blade server, a multi-node server or other electronic devices according to practical applications. Furthermore, the number of the electronic components 12 may be determined according to practical applications, so the invention is not limited to the embodiment shown in the figures.

As shown in FIGS. 2 and 3, the chassis 10 comprises a casing 14 and a tray 16, and the tray 16 comprises a tray body 160 and an operating member 162. The tray 16 is movably disposed in the casing 14. The tray body 160 has an accommodating space S1 and the operating member 162 is pivotally connected to the tray body 160, such that the operating member 162 is able to rotate between a closed position (as shown in FIGS. 2 and 3) and an opened position (as shown in FIG. 10) within the accommodating space S1. In other words, a rotating range of the operating member 162 falls within a projection range of the accommodating space S1 of the tray body 160, i.e. the operating member 162 rotates inside the tray body 160. When the tray 16 is disposed in the casing 14, the operating member 162 rotates inside the chassis 10. In this embodiment, the operating member 162 may be pivotally connected to a side wall 1600 of the tray body 160, but the invention is not so limited. In another embodiment, the operating member 162 may also be pivotally connected to a suitable position inside the tray body 160 as long as the operating member 162 is able to rotate between the closed position and the opened position within the accommodating space S1. In practical applications, the tray 16 may comprise two operating members 162 pivotally connected to two opposite side walls 1600 or other suitable positions of the tray 16, but the invention is not so limited.

When the operating member 162 is located at the closed position shown in FIG. 2, the operating member 162 and the casing 14 are locked, and the electronic component 12 is able to be accommodated in the accommodating space S1. At this time, a user may place the electronic component 12 into the chassis 10 or take the electronic component 12 out from the chassis 10. When the electronic component 12 is removed from the accommodating space S1 (as shown in FIG. 2), the operating member 162 is able to rotate from the closed position to the opened position, such that the operating member 162 is unlocked from the casing 14. At this time, the user may take the tray 16 out from the casing 14. When the user places the tray 16 into the casing 14, the user only needs to rotate the operating member 162 from the opened position to the closed position, such that the operating member 162 and the casing 14 can be locked.

For further explanation, during assembly, the user needs to assemble the tray 16 to the casing 14 first before assembling the electronic component 12 to the tray 16; and during disassembly, the user needs to disassemble the electronic component 12 from the tray 16 first before disassembling the tray 16 from the casing 14. Since the operating member 162 is hidden inside the tray 16, the sequence of assembling and disassembling the electronic component 12 and the tray 16 can be ensured to prevent the electronic component 12 from being damaged due to incorrect operation.

As shown in FIGS. 4 and 5, the operating member 162 may have a rotating portion 1620 and a handle portion 1622. The rotating portion 1620 is pivotally connected to the side wall 1600 of the tray body 160, and the handle portion 1622 extends from the rotating portion 1620. In this embodiment, the handle portion 1622 may extend obliquely from the rotating portion 1620. In another embodiment, the handle portion 1622 may also extend horizontally from the rotating portion 1620 according to practical applications. In this embodiment, the rotating portion 1620 may be pivotally connected to the side wall 1600 of the tray body 160 by a shaft 164, and the shaft 164 may be fixed to the side wall 1600 of the tray body 160 by a fixing member 166 (e.g. screw). Accordingly, the user may hold the handle portion 1622 to rotate the operating member 162, such that the operating member 162 rotates between the closed position (as shown in FIGS. 2 and 3) and the opened position (as shown in FIG. 10) through the rotating portion 1620. In this embodiment, the tray 16 may further comprise a first elastic member 168, wherein the first elastic member 168 may be sleeved on the shaft 164 and opposite ends of the first elastic member 168 respectively abut against the operating member 162 and the side wall 1600 of the tray body 160. The first elastic member 168 may be, but is not limited to, a torsion spring.

As shown in FIG. 4, the tray 16 may further comprise a first restraining member 170, a second restraining member 172 and a second elastic member 174, wherein the first restraining member 170 may be disposed on the side wall 1600 of the tray body 160, and the second restraining member 172 may be disposed on the operating member 162. In this embodiment, the second restraining member 172 may be pivotally connected to the handle portion 1622 of the operating member 162 by a shaft 176. The second elastic member 174 may be sleeved on the shaft 176 and opposite ends of the second elastic member 174 respectively abut against the operating member 162 and the second restraining member 172. The second elastic member 174 may be, but is not limited to, a torsion spring.

As shown in FIGS. 2 and 3, when the operating member 162 is located at the closed position, the second restraining member 172 and the first restraining member 170 are locked to restrain the operating member 162 from rotating. As shown in FIG. 4, the first restraining member 170 may have an engaging recess 1700. Thus, the second restraining member 172 may engage with the engaging recess 1700 of the first restraining member 170 to restrain the operating member 162 from rotating. In this embodiment, the side wall 1600 of the tray body 160 may have a recess 1602. When the operating member 162 is located at the closed position, the operating member 162 can be accommodated in the recess 1602 to prevent interference with the electronic component 12 shown in FIG. 1.

As shown in FIGS. 5 to 7, the casing 14 may have a first engaging portion 140 and the operating member 162 may have a second engaging portion 1624. In this embodiment, the casing 14 and the operating member 162 may have two first engaging portions 140 and two second engaging portions 1624 corresponding to each other, but the invention is not so limited. When the operating member 162 is located at the closed position shown in FIG. 2, the second engaging portion 1624 engages with the first engaging portion 140 (as shown in FIGS. 5 and 6), such that the operating member 162 and the casing 14 are locked. Accordingly, the tray 16 is locked in the casing 14.

When the user wants to take the tray 16 out from the casing 14, the user may press the second restraining member 172. When the second restraining member 172 is pressed, the second restraining member 172 rotates to disengage from the engaging recess 1700 of the first restraining member 170, such that the operating member 162 is able to rotate from the closed position toward the opened position. It should be noted that when the operating member 162 is located at the closed position shown in FIG. 2, the first elastic member 168 shown in FIG. 4 is compressed. Thus, as shown in FIGS. 8 and 9, when the second restraining member 172 is unlocked from the first restraining member 170, the first elastic member 168 (as shown in FIG. 4) drives the operating member 162 to rotate toward the opened position, so as to form an operating space S2 between the operating member 162 and the side wall 1600 of the tray body 160. At this time, the user may extend his/her fingers into the operating space S2 to hold the handle portion 1622 of the operating member 162. Then, the user may rotate the operating member 162 toward the opened position. As shown in FIGS. 10 and 11, when the operating member 162 is located at the opened position, the second engaging portion 1624 disengages from the first engaging portion 140, such that the operating member 162 is unlocked from the casing 14. Accordingly, the tray 16 can be removed from the casing 14.

As shown in FIGS. 5 and 6, the casing 14 may have a first linkage portion 142 and the operating member 162 may have a second linkage portion 1626. In this embodiment, the casing 14 and the operating member 162 may have two first linkage portions 142 and two second linkage portions 1626 corresponding to each other, but the invention is not so limited. As shown in FIGS. 9 and 12, when the operating member 162 rotates toward the opened direction, the second linkage portion 1626 pushes the first linkage portion 142 to drive the tray body 160 to move toward an outside of the casing 14. Then, the user may pull the operating member 162 to take the tray 16 out from the casing 14.

Furthermore, the user may place the tray 16 into the casing 14, as shown in FIG. 11. Then, the user may rotate the operating member 162 toward the closed position. As shown in FIGS. 11 and 7, when the operating member 162 rotates toward the closed position, the second engaging portion 1624 pushes the first engaging portion 140 to drive the tray body 160 to move toward an inside of the casing 14. At the same time, the second engaging portion 1624 engages with the first engaging portion 140, such that the operating member 162 and the casing 140 are locked. In this embodiment, the first restraining member 170 may further have an inclined guiding surface 1702. When the operating member 162 rotates from the opened position toward the closed position, the inclined guiding surface 1702 guides the second restraining member 172 to engage with the engaging recess 1700 of the first restraining member 170. For further explanation, when the operating member 162 rotates from the opened position toward the closed position, the inclined guiding surface 1702 pushes the second restraining member 172, such that the second restraining member 172 rotates toward the operating member 162. After the second restraining member 172 is aligned with the engaging recess 1700, the second elastic member 174 (as shown in FIG. 4) returns the second restraining member 172 toward the first restraining member 170, such that the second restraining member 172 engages with the engaging recess 1700 of the first restraining member 170.

Figure 13:
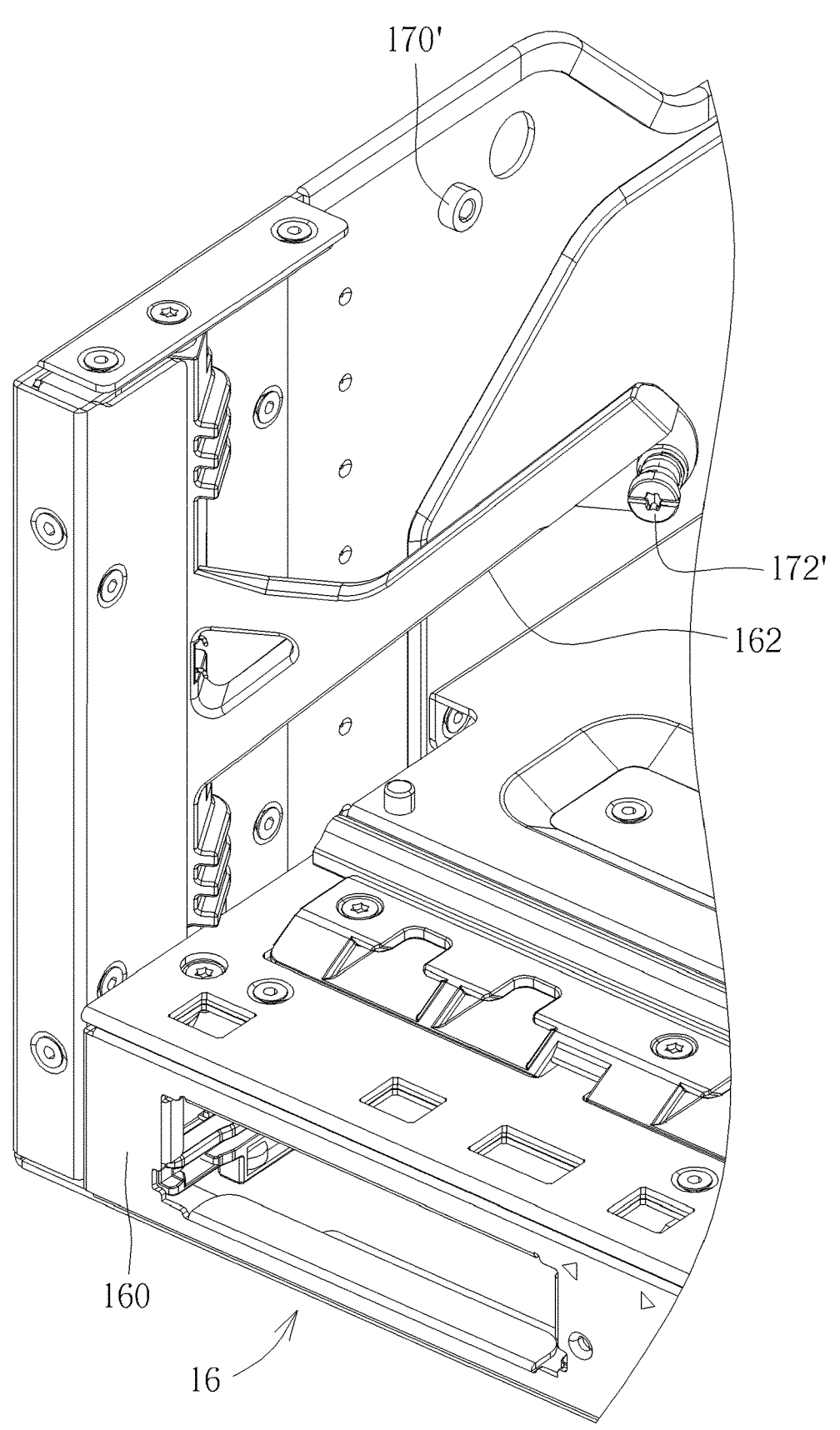
FIG. 13 is a perspective view illustrating a first restraining member and a second restraining member according to another embodiment of the invention.
Figure 14:
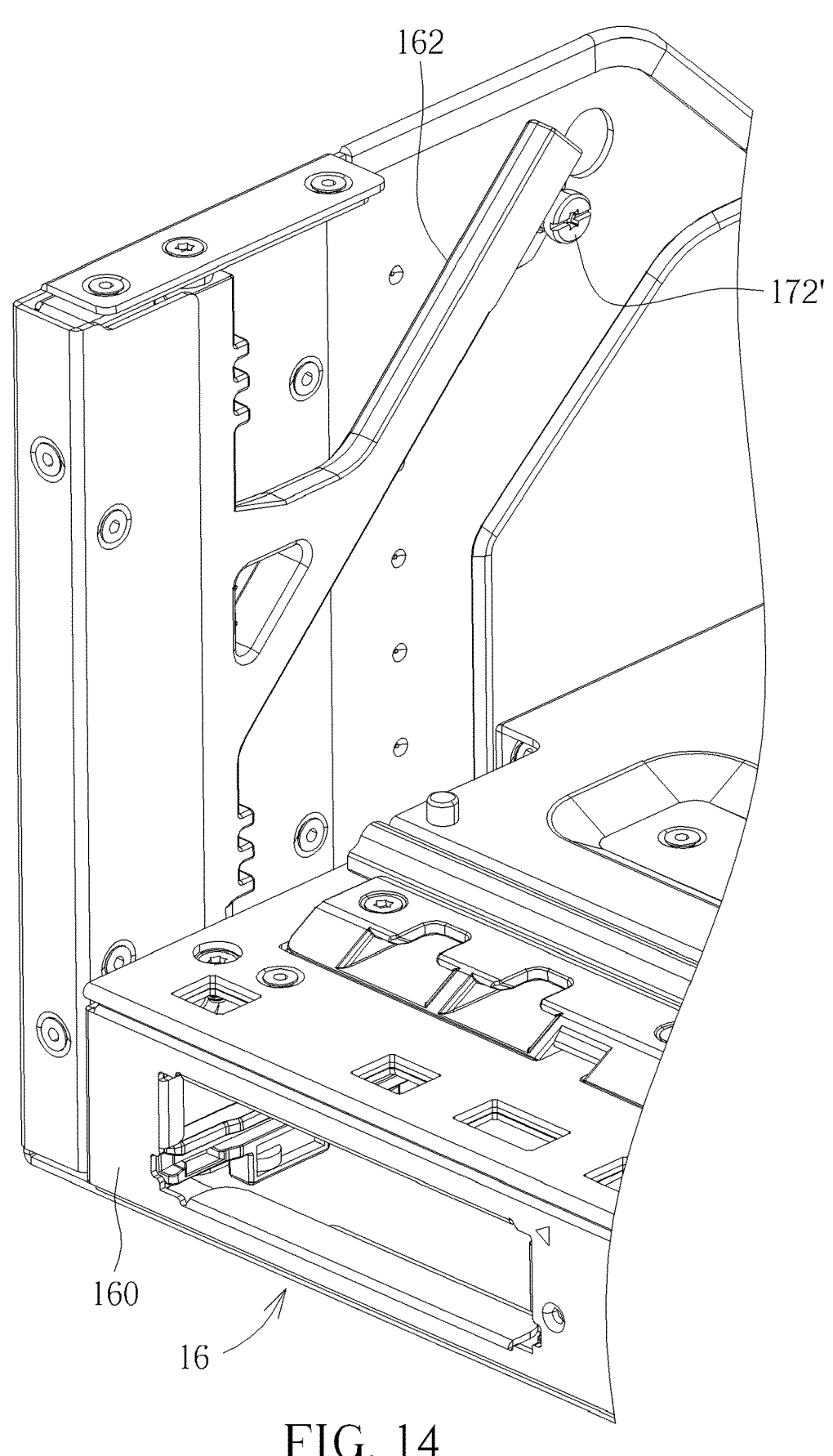
FIG. 14 is a perspective view illustrating the operating member located at the closed position according to an embodiment.

Referring to FIGS. 13 and 14, FIG. 13 is a perspective view illustrating a first restraining member 170' and a second restraining member 172' according to another embodiment of the invention, and FIG. 14 is a perspective view illustrating the operating member 162 located at the closed position according to an embodiment.

As shown in FIGS. 13 and 14, in another embodiment, the first restraining member 170' may be a stud and the second restraining member 172' may be a thumb screw. The user may rotate the second restraining member 172' to lock the first restraining member 170' and the second restraining member 172', such that the operating member 162 is locked at the closed position shown in FIG. 14. Furthermore, the user may rotate the second restraining member 172' to unlock the first restraining member 170' and the second restraining member 172', such that the operating member 162 is able to rotate to the opened position shown in FIG. 13.

Figure 15:
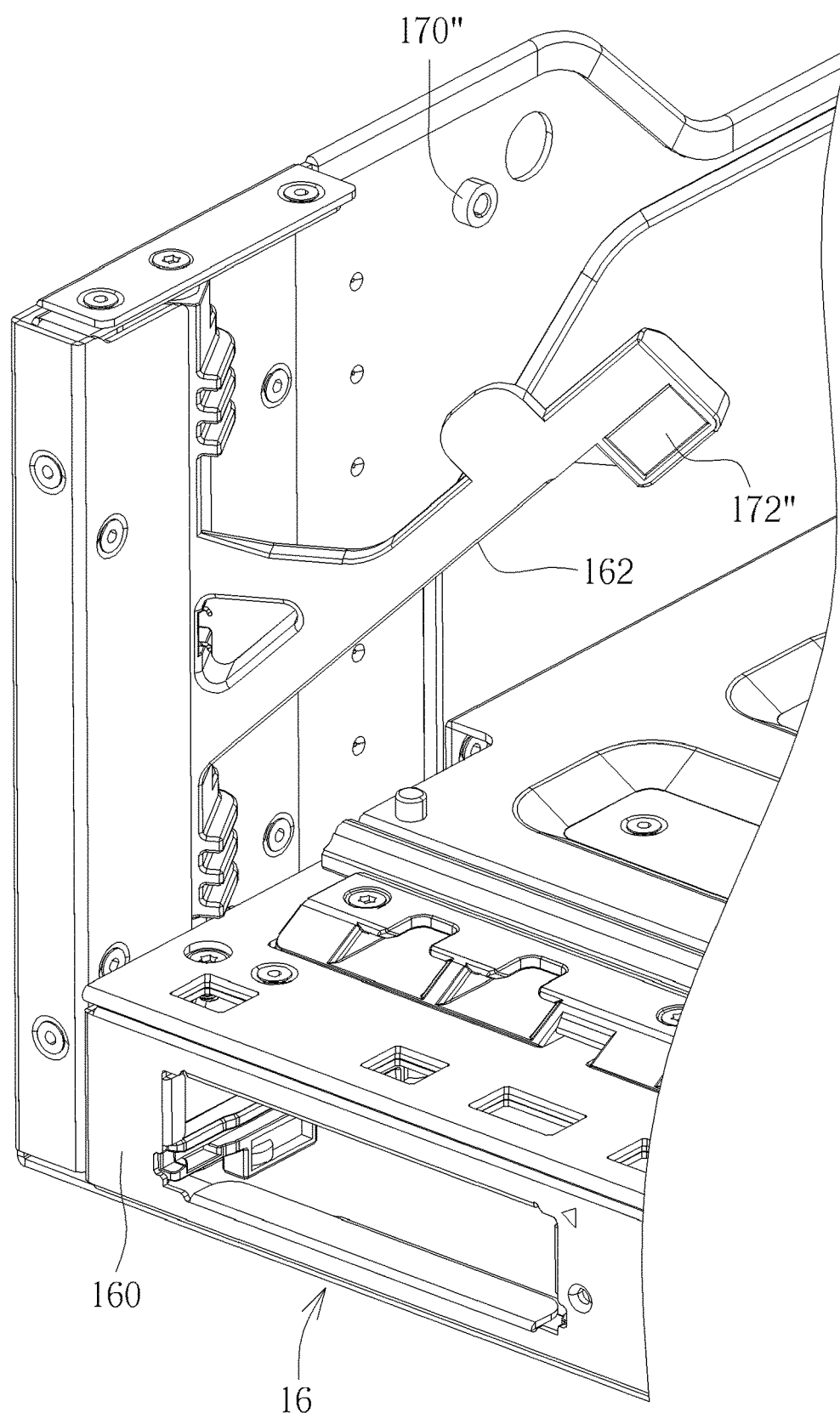
FIG. 15 is a perspective view illustrating a first restraining member and a second restraining member according to another embodiment of the invention.
Figure 16:
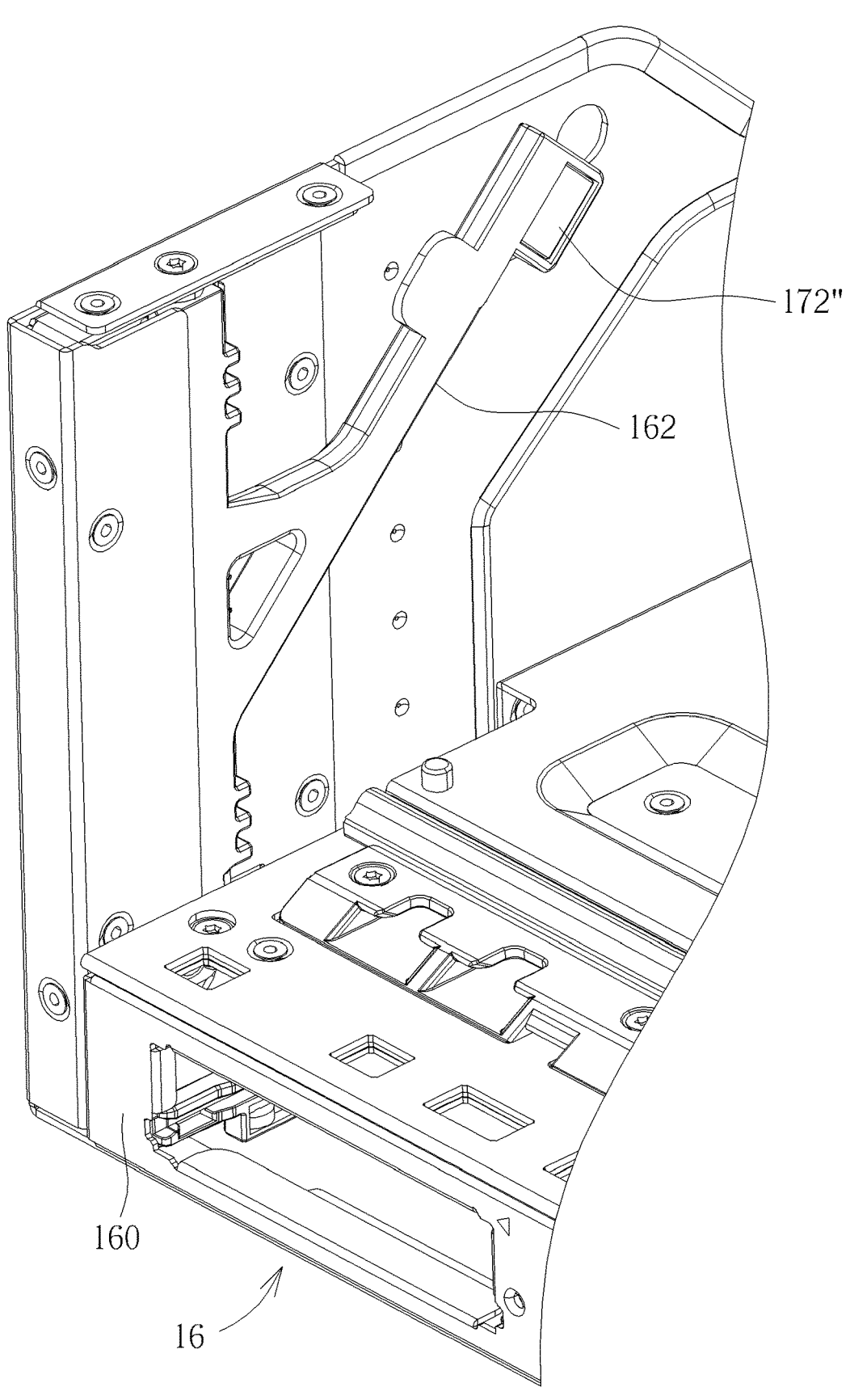
FIG. 16 is a perspective view illustrating the operating member located at the closed position according to an embodiment.

Referring to FIGS. 15 and 16, FIG. 15 is a perspective view illustrating a first restraining member 170" and a second restraining member 172" according to another embodiment of the invention, and FIG. 16 is a perspective view illustrating the operating member 162 located at the closed position according to an embodiment.

As shown in FIGS. 15 and 16, in another embodiment, one of the first restraining member 170" and the second restraining member 172" may be a magnet, and the other one of the first restraining member 170" and the second restraining member 172" may be a magnet or a magnetic induction material (e.g. metal). The first restraining member 170" and the second restraining member 172" can be magnetically attracted to each other, such that the operating member 162 is locked at the closed position shown in FIG. 16. Furthermore, the user may pull the operating member 162 to overcome the magnetic attraction force between the first restraining member 170" and the second restraining member 172", such that the operating member 162 is able to rotate to the opened position shown in FIG. 15.

As mentioned in the above, since the operating member is hidden inside the tray, the sequence of assembling and disassembling the electronic component and the tray can be ensured to prevent the electronic component from being damaged due to incorrect operation. Furthermore, the operating member does not occupy the setting space of the front bezel of the tray, such that the front bezel of the tray may be equipped with more components (e.g. E1.S solid state drives, network cards, etc.), and heat dissipation holes may also be added to improve heat dissipation efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data processing device comprising:
   a chassis comprising a casing and a tray disposed in the casing, the tray comprising a tray body and an operating member pivotally connected to the tray body, the tray body having an accommodating space, the operating member rotating between a closed position and an opened position within the accommodating space; and
   at least one electronic component;

wherein, when the operating member is located at the closed position, the operating member and the casing are locked, and the at least one electronic component is able to be accommodated in the accommodating space; wherein, when the at least one electronic component is removed from the accommodating space, the operating member is able to rotate from the closed position to the opened position located in the accommodating space to be unlocked from the casing, so as to allow the tray to be removed from the casing.

2. The data processing device of claim 1, wherein the operating member has a rotating portion and a handle portion, the rotating portion is pivotally connected to the tray body, and the handle portion extends from the rotating portion.

3. The data processing device of claim 1, wherein the tray further comprises a first restraining member and a second restraining member, the first restraining member is disposed on a side wall of the tray body, the second restraining member is disposed on the operating member; wherein, when the operating member is located at the closed position, the second restraining member and the first restraining member are locked to restrain the operating member from rotating.

4. The data processing device of claim 3, wherein the tray further comprises a first elastic member, opposite ends of the first elastic member respectively abut against the operating member and the side wall of the tray body; wherein, when the second restraining member is unlocked from the first restraining member, the first elastic member drives the operating member to rotate toward the opened position, so as to form an operating space between the operating member and the side wall.

5. The data processing device of claim 3, wherein the second restraining member is pivotally connected to the operating member, the first restraining member has an engaging recess, and the second restraining member engages with the engaging recess to restrain the operating member from rotating; wherein, when the second restraining member is pressed, the second restraining member rotates to disengage from the engaging recess, such that the operating member is able to rotate from the closed position toward the opened position.

6. The data processing device of claim 5, wherein the tray further comprises a second elastic member, and opposite ends of the second elastic member respectively abut against the operating member and the second restraining member.

7. The data processing device of claim 5, wherein the first restraining member further has an inclined guiding surface; wherein, when the operating member rotates from the opened position toward the closed position, the inclined guiding surface guides the second restraining member to engage with the engaging recess.

8. The data processing device of claim 3, wherein the first restraining member is a stud and the second restraining member is a thumb screw.

9. The data processing device of claim 3, wherein one of the first restraining member and the second restraining member is a magnet, and the other one of the first restraining member and the second restraining member is a magnet or a magnetic induction material.

10. The data processing device of claim 1, wherein the casing has a first engaging portion and the operating member has a second engaging portion; wherein, when the operating member is located at the closed position, the second engaging portion engages with the first engaging portion; wherein, when the operating member is located at the opened position, the second engaging portion disengages from the first engaging portion.

11. The data processing device of claim 10, wherein, when the operating member rotates toward the closed position, the second engaging portion pushes the first engaging portion to drive the tray body to move toward an inside of the casing.

12. The data processing device of claim 1, wherein the casing has a first linkage portion and the operating member has a second linkage portion; wherein, when the operating member rotates toward the opened direction, the second linkage portion pushes the first linkage portion to drive the tray body to move toward an outside of the casing.

13. The data processing device of claim 1, wherein the tray body has a recess; wherein, when the operating member is located at the closed position, the operating member is accommodated in the recess.

14. A chassis comprising:
   a casing; and
   a tray disposed in the casing, the tray comprising a tray body and an operating member pivotally connected to the tray body, the tray body having an accommodating space, the operating member rotating between a closed position and an opened position within the accommodating space; and
   wherein, when the operating member is located at the closed position, the operating member and the casing are locked; wherein, when the operating member rotates from the closed position to the opened position located in the accommodating space, the operating member is unlocked from the casing, so as to allow the tray to be removed from the casing.

15. The chassis of claim 14, wherein the operating member has a rotating portion and a handle portion, the rotating portion is pivotally connected to the tray body, and the handle portion extends from the rotating portion.

16. The chassis of claim 14, wherein the tray further comprises a first restraining member, a second restraining member and a first elastic member, the first restraining member is disposed on a side wall of the tray body, the second restraining member is disposed on the operating member, opposite ends of the first elastic member respectively abut against the operating member and the side wall of the tray body; wherein, when the operating member is located at the closed position, the second restraining member and the first restraining member are locked to restrain the operating member from rotating; wherein, when the second restraining member is unlocked from the first restraining member, the first elastic member drives the operating member to rotate toward the opened position, so as to form an operating space between the operating member and the side wall.

17. The chassis of claim 16, wherein the second restraining member is pivotally connected to the operating member, the first restraining member has an engaging recess, the second restraining member engages with the engaging recess to restrain the operating member from rotating, the tray further comprises a second elastic member, opposite ends of the second elastic member respectively abut against the operating member and the second restraining member, the first restraining member further has an inclined guiding surface; wherein, when the second restraining member is pressed, the second restraining member rotates to disengage from the engaging recess, such that the operating member is able to rotate from the closed position toward the opened position; wherein, when the operating member rotates from the opened position toward the closed position, the inclined guiding surface guides the second restraining member to engage with the engaging recess.

18. The chassis of claim 14, wherein the casing has a first engaging portion and a first linkage portion, the operating member has a second engaging portion and a second linkage portion; wherein, when the operating member is located at the closed position, the second engaging portion engages with the first engaging portion; wherein, when the operating member is located at the opened position, the second engaging portion disengages from the first engaging portion, wherein, when the operating member rotates toward the closed position, the second engaging portion pushes the first engaging portion to drive the tray body to move toward an inside of the casing; wherein, when the operating member rotates toward the opened direction, the second linkage portion pushes the first linkage portion to drive the tray body to move toward an outside of the casing.

19. The chassis of claim 14, wherein the tray body has a recess; wherein, when the operating member is located at the closed position, the operating member is accommodated in the recess.

20. A tray adapted to be disposed in a casing, the tray comprising:
  a tray body having an accommodating space; and
  an operating member pivotally connected to the tray body, the operating member rotating between a closed position and an opened position within the accommodating space; and
  wherein, when the operating member is located at the closed position, the operating member and the casing are locked; wherein, when the operating member rotates from the closed position to the opened position located in the accommodating space, the operating member is unlocked from the casing, so as to allow the tray to be removed from the casing.

21. The tray of claim 20, wherein the operating member has a rotating portion and a handle portion, the rotating portion is pivotally connected to the tray body, and the handle portion extends from the rotating portion.

22. The tray of claim 20, further comprising a first restraining member and a second restraining member, wherein the first restraining member is disposed on a side wall of the tray body, the second restraining member is disposed on the operating member; wherein, when the operating member is located at the closed position, the second restraining member and the first restraining member are locked to restrain the operating member from rotating.

23. The tray of claim 22, further comprising a first elastic member, wherein opposite ends of the first elastic member respectively abut against the operating member and the side wall of the tray body; wherein, when the second restraining member is unlocked from the first restraining member, the first elastic member drives the operating member to rotate toward the opened position, so as to form an operating space between the operating member and the side wall.

24. The tray of claim 22, wherein the second restraining member is pivotally connected to the operating member, the first restraining member has an engaging recess, and the second restraining member engages with the engaging recess to restrain the operating member from rotating; wherein, when the second restraining member is pressed, the second restraining member rotates to disengage from the engaging recess, such that the operating member is able to rotate from the closed position toward the opened position.

25. The tray of claim 24, wherein the tray further comprises a second elastic member, opposite ends of the second elastic member respectively abut against the operating member and the second restraining member, the first restraining member further has an inclined guiding surface; wherein, when the operating member rotates from the opened position toward the closed position, the inclined guiding surface guides the second restraining member to engage with the engaging recess.

26. The tray of claim 20, wherein the tray body has a recess; wherein, when the operating member is located at the closed position, the operating member is accommodated in the recess.

\* \* \* \* \*